United States Patent
Jeong et al.

(10) Patent No.: US 8,305,141 B2
(45) Date of Patent: Nov. 6, 2012

(54) DISTRIBUTED DOHERTY POWER AMPLIFIER

(75) Inventors: Yoon Ha Jeong, Pohang-si (KR); Mun-Woo Lee, Daegu (KR); Yong-Sub Lee, Pohang-si (KR)

(73) Assignee: Postech Academy-Industry Foundation, Pohang-Si (KR)

( * ) Notice: Subject to any disclaimer, the term of this patent is extended or adjusted under 35 U.S.C. 154(b) by 1 day.

(21) Appl. No.: 12/964,206

(22) Filed: Dec. 9, 2010

(65) Prior Publication Data

US 2011/0175677 A1     Jul. 21, 2011

(30) Foreign Application Priority Data

Jan. 20, 2010  (KR) .................. 10-2010-0005078

(51) Int. Cl.
*H03F 3/68* (2006.01)
(52) U.S. Cl. ............. 330/124 R; 330/295; 330/286
(58) Field of Classification Search ........... 330/124 R, 330/295, 286, 53–54, 84
See application file for complete search history.

(56) References Cited

U.S. PATENT DOCUMENTS 7,262,656 B2 * 8/2007 Shiikuma .......... 330/124 R
7,688,135 B2 * 3/2010 Kim et al. ......... 330/124 R
2011/0140775 A1 * 6/2011 Hong et al. ........ 330/124 R

FOREIGN PATENT DOCUMENTS

| JP | 06-152262 A | 5/1994 |
| JP | 2004-173231 A | 6/2004 |
| JP | 2006-067176 A | 3/2006 |
| JP | 2007-134847 A | 5/2007 |
| JP | 2009-206675 A | 9/2009 |
| JP | 2010-530148 A | 9/2010 |
| WO | 2007/046370 A1 | 4/2007 |
| WO | 2008/012898 A1 | 1/2008 |

* cited by examiner

*Primary Examiner* — Hieu Nguyen
(74) *Attorney, Agent, or Firm* — Kile Park Goekjian Reed & McManus PLLC

(57) ABSTRACT

Provided is a distributed Doherty power amplifier exhibiting high efficiency and linearity at a wide range of bandwidths, the distributed Doherty power amplifier including a first amplifier; a second amplifier, which is connected to the first amplifier in parallel; a first shifting unit, which is interconnected between the input of the first amplifier and the input of the second amplifier and inverses the phase of the input of the second amplifier; and a second shifting unit, which is interconnected between the output of the first amplifier and the output of the second amplifier and inverses the phase of the output of the second amplifier, wherein the first amplifier and the second amplifier are Doherty power amplifiers, and each of the Doherty power amplifiers includes a carrier amplifier and a peaking amplifier, which are connected in parallel.

11 Claims, 7 Drawing Sheets

DISTRIBUTED DOHERTY POWER AMPLIFIER

CROSS-REFERENCE TO RELATED PATENT APPLICATION

This application claims the benefit of Korean Patent Application No. 10-2010-0005078, filed on Jan. 10, 2010, in the Korean Intellectual Property Office, the disclosure of which is incorporated herein in its entirety by reference.

BACKGROUND OF THE INVENTION

1. Field of the Invention

The present invention relates to a distributed Doherty power amplifier, and more particularly, to a power amplifier, which exhibits broadband characteristics by connecting a first Doherty power amplifier and a second Doherty power amplifier in a distributed structure and exhibits a characteristic of offsetting tertiary distortion signals generated from the first Doherty power amplifier and the second Doherty power amplifier.

2. Description of the Related Art

Currently, a mobile communication system requires broad bandwidth and high linearity. Signals having broad bandwidth and high linearity exhibit a high peak-to-average power ratio (PAPR), and a power amplifier used in a base station or a relay base shall be operated at a large back-off power (BOP) to satisfy the high PAPR. However, a power amplifier operating in a large BOP domain exhibits a low efficiency, and, if an additional circuit is added for linearization of the power amplifier, the additional circuit further lowers efficiency of the overall mobile communication system.

Doherty power amplifiers exhibiting high efficiency at a relatively low output power are being researched to improve the efficiency of a power amplifier. In a Doherty power amplifier, a carrier amplifier and a peaking amplifier are connected to each other in parallel, and the efficiency of the Doherty power amplifier increases as load impedances of the carrier amplifier and the peaking amplifier vary according to magnitudes of input power. To change a load impedance of a Doherty power amplifier, a $\lambda/4$ transmission line is used in the output of the carrier amplifier. However, since a $\lambda/4$ transmission line is designed for one operation frequency, the $\lambda/4$ transmission line cannot function as an impedance changer with respect to another operation frequency, and thus it is difficult to maintain a high operation efficiency.

On the other hand, a distributed power amplifier is widely used to increase a bandwidth of a power amplifier. The distributed power amplifier not only exhibits a flat gain and a small reflection coefficient in a broad bandwidth, but also requires no power distributor and no power combiner for the input and output of two power amplifiers connected in parallel. However, the distributed power amplifier exhibits low output power and low efficiency.

SUMMARY OF THE INVENTION

As described above, in a conventional Doherty power amplifier, although a $\lambda/4$ transmission line plays a major role for changing an output impedance, a $\lambda/4$ transmission line designed to be bound to a single operation frequency cannot function as a $\lambda/4$ transmission line at other frequencies, and thus it is difficult to operate a Doherty power amplifier at the other frequencies. Therefore, it is difficult to acquire high efficiency in a conventional Doherty power amplifier.

Furthermore, although a conventional distributed power amplifier has an advantage in terms of a broad bandwidth, the conventional distributed power amplifier is mostly used as a gain amplifier or a drive amplifier used at a low output due to small output power and low efficiency.

Therefore, the present invention provides a distributed Doherty power amplifier exhibiting high efficiency and linearity at a wide range of bandwidths.

The present invention also provides a distributed Doherty power amplifier, which reduces tertiary distortion signals by offsetting the tertiary distortion signals generated from a first Doherty power amplifier and a second Doherty power amplifier.

According to an aspect of the present invention, there is provided a distributed Doherty power amplifier including a first amplifier; a second amplifier, which is connected to the first amplifier in parallel; a first shifting unit, which is interconnected between the input of the first amplifier and the input of the second amplifier and inverses the phase of the input of the second amplifier; and a second shifting unit, which is interconnected between the output of the first amplifier and the output of the second amplifier and inverses the phase of the output of the second amplifier, wherein the first amplifier and the second amplifier are Doherty power amplifiers, and each of the Doherty power amplifiers includes a carrier amplifier and a peaking amplifier, which are connected in parallel.

Furthermore, the distributed Doherty power amplifier further includes a third shifting unit, which is connected to the first shifting unit and the input of the second amplifier and separates a gate of the second amplifier from a ground connection; and a fourth shifting unit, which is connected to the second shifting unit and the input of the second amplifier and separates a drain of the second amplifier from the ground connection.

Furthermore, the first shifting unit and the second shifting unit are $\lambda/2$ transmission lines.

Furthermore, the third shifting unit and the fourth shifting unit are $\lambda/4$ transmission lines.

Furthermore, the distributed Doherty power amplifier further includes a first capacitor, which is disposed between the third shifting unit and the ground connection; and a second capacitor, which is disposed between the fourth shifting unit and the ground connection.

Furthermore, the Doherty power amplifier includes a distributor, which divides an input of the Doherty power amplifier into two signals and inputs the two signals to the carrier amplifier and the peaking amplifier, respectively; a second transmission line, which is connected to the output of the peaking amplifier and prevents leakage of the output of the carrier amplifier; a second transmission line, which is connected to the output of the carrier amplifier and compensates for a delay of the first transmission line; and a third transmission line, which is connected to the output of the first transmission line and the output of the second transmission line and adjusts load impedance of the carrier amplifier.

Furthermore, the distributor divides an input of the Doherty power amplifier into two signals, of which phases are different by 90°, the first transmission line and the second transmission line are 50Ω transmission lines, and the third transmission line is a $\lambda/4$ transmission line.

Furthermore, the first amplifier and the second amplifier further include drive amplifiers connected to the Doherty power amplifiers in series.

Furthermore, the magnitude and phase of a tertiary distortion signal is changed by adjusting gate biases of the peaking amplifier of the first amplifier and the peaking amplifier of the second amplifier.

Furthermore, gate biases of the peaking amplifier of the first amplifier and the peaking amplifier of the second amplifier are adjusted, so that a tertiary distortion signal of the first amplifier and a tertiary distortion signal of the second amplifier have the same magnitude and opposite phases.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. In the description of the present invention, if it is determined that a detailed description of commonly-used technologies or structures related to the invention may unnecessarily obscure the subject matter of the invention, the detailed description will be omitted. Also, since later-described terms are defined in consideration of the functions of the present invention, they may vary according to users' intentions or practice. Hence, the terms must be interpreted based on the contents of the entire specification.

Figure 1:
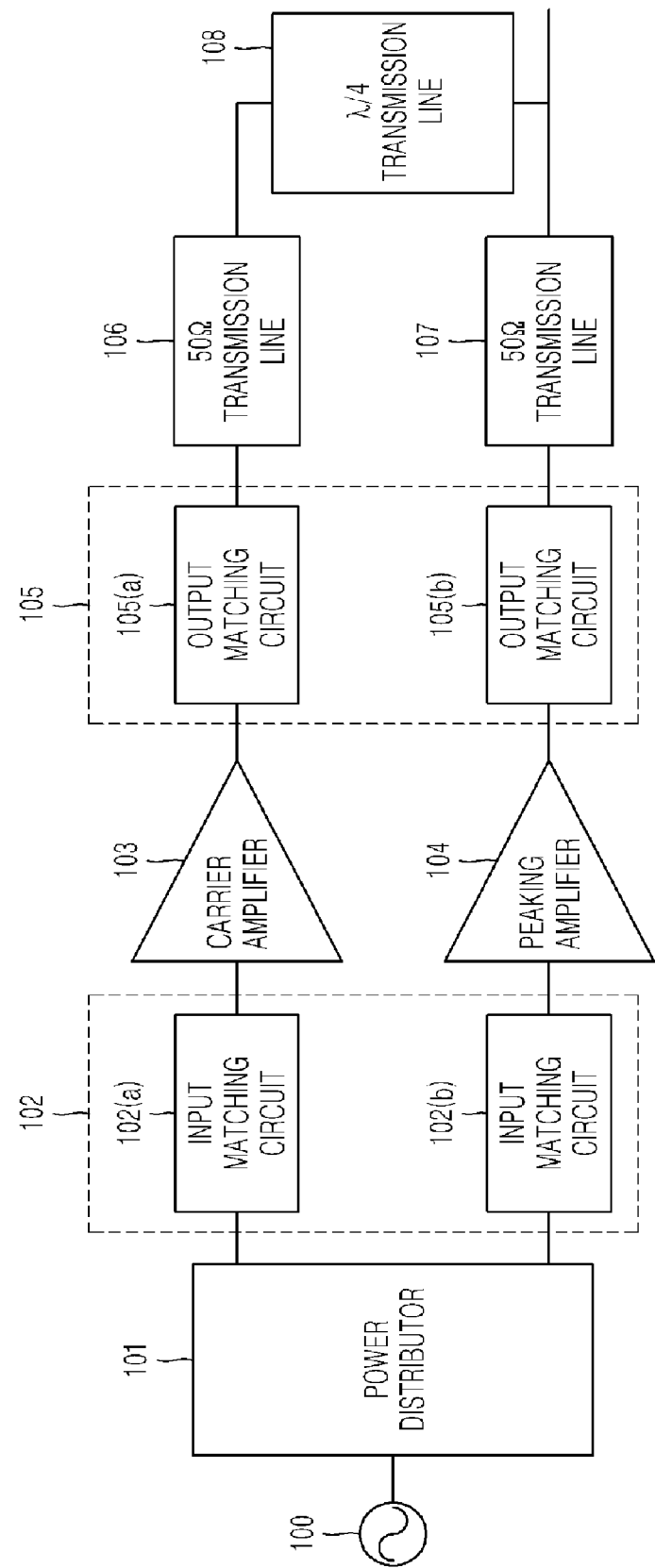
FIG. 1 is a circuit diagram of a Doherty power amplifier.

FIG. 1 is a circuit diagram of a Doherty power amplifier.

Referring to FIG. 1, a source signal generated by a signal generator 100 is divided into two signals, of which phases are different by 90°, via a power distributor 101. A Doherty power amplifier has a structure in which a carrier amplifier 103 and a peaking amplifier 104 are connected in parallel, and each of the carrier amplifier 103 and the peaking amplifier 104 includes an input matching circuit 102 and an output matching circuit 105.

An input matching circuit 102a of the carrier amplifier 103 matches input impedances of the carrier amplifier 103 and outputs of the power distributor 101, whereas an input matching circuit 102b of the peaking amplifier 104 matches input impedances of the peaking amplifier 104 and input of the power distributor 101, of which the phase is changed by 90°.

When an output of the Doherty power amplifier is small, the load impedance of the carrier amplifier 103 is doubled by a λ/4 transmission line 108, and the peaking amplifier 104 does not operate. As a result, a Doherty power amplifier exhibits high efficiency. At this point, to prevent the output of the carrier amplifier 103 from inputting to the peaking amplifier 104 not operating, a 50Ω transmission line 107 is added to an output matching circuit 105b of the peaking amplifier 104, so that impedance of an output of the carrier amplifier 103 and the peaking amplifier 104 is sufficiently large. To compensate for a signal delay due to the 50Ω transmission line 107 added to the peaking amplifier 104, a 50Ω transmission line 106 is additionally connected to an output matching circuit 105a of the carrier amplifier 103.

As outputs of the Doherty power amplifier becomes larger, the carrier amplifier 103 and the peaking amplifier 104 operate simultaneously, and load impedances of the carrier amplifier 103 and the peaking amplifier 104 change back to original load impedances of the carrier amplifier 103 and the peaking amplifier 104. The load impedances are maintained until output power of the Doherty power amplifier is saturated.

A distributed power amplifier is widely used to increase a bandwidth of a power amplifier. The distributed power amplifier not only exhibits a flat gain and a small reflection coefficient in a broad bandwidth, but also requires no power distributor and no power combiner for input and output of two power amplifiers connected in parallel, unlike a balanced amplifier.

Figure 2:
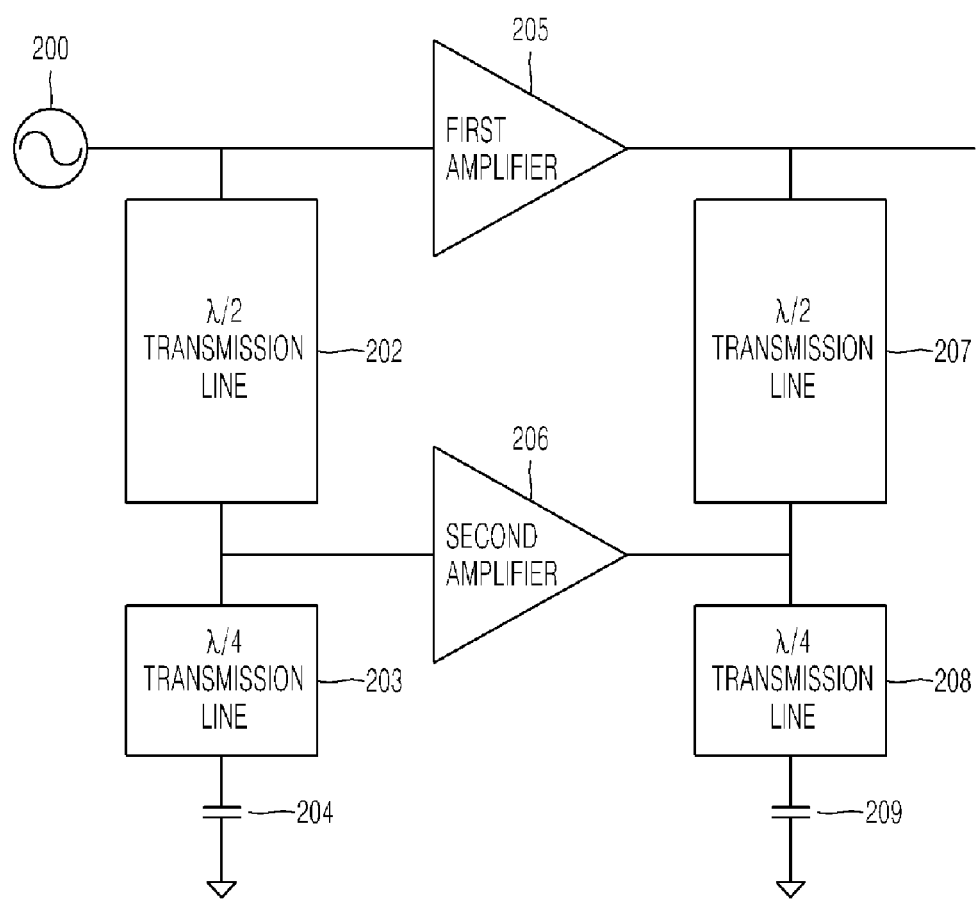
FIG. 2 is a circuit diagram of a distributed power amplifier.

FIG. 2 is a circuit diagram of a distributed power amplifier.

Referring to FIG. 2, a source signal generated by a signal generator 200 is used as an input of power amplifiers connected in parallel. To increase a gain of the overall distributed power amplifier, a first power amplifier 205 and a second power amplifier 206 are connected via a λ/2 transmission line 202, such that signals input to the first power amplifier 205 and the second power amplifier 206 are different by 180°. Next, to separate a gate of a power amplifier from a ground connection, the ground connection and the input of the second power amplifier 206 are connected via a λ/4 transmission line 203. Furthermore, for optimization of the performance of the distributed power amplifier, a capacitor 204 is added to the ground connection. The capacitor 204 enhances frequency characteristics of the distributed power amplifier. The output of the first power amplifier 205 and the output of the second power amplifier 206 are connected via a λ/2 transmission line 207 to compensate for the phase difference, which is 180°, of the inputs due to the λ/2 transmission line 202. Furthermore, to separate a drain of a power amplifier from the ground connection, a λ/4 transmission line 208 is connected between the output of the second power amplifier 206 and the ground connection. Furthermore, a capacitor 209 is added to the ground connection to optimize the performance of the distributed power amplifier.

Figure 3:
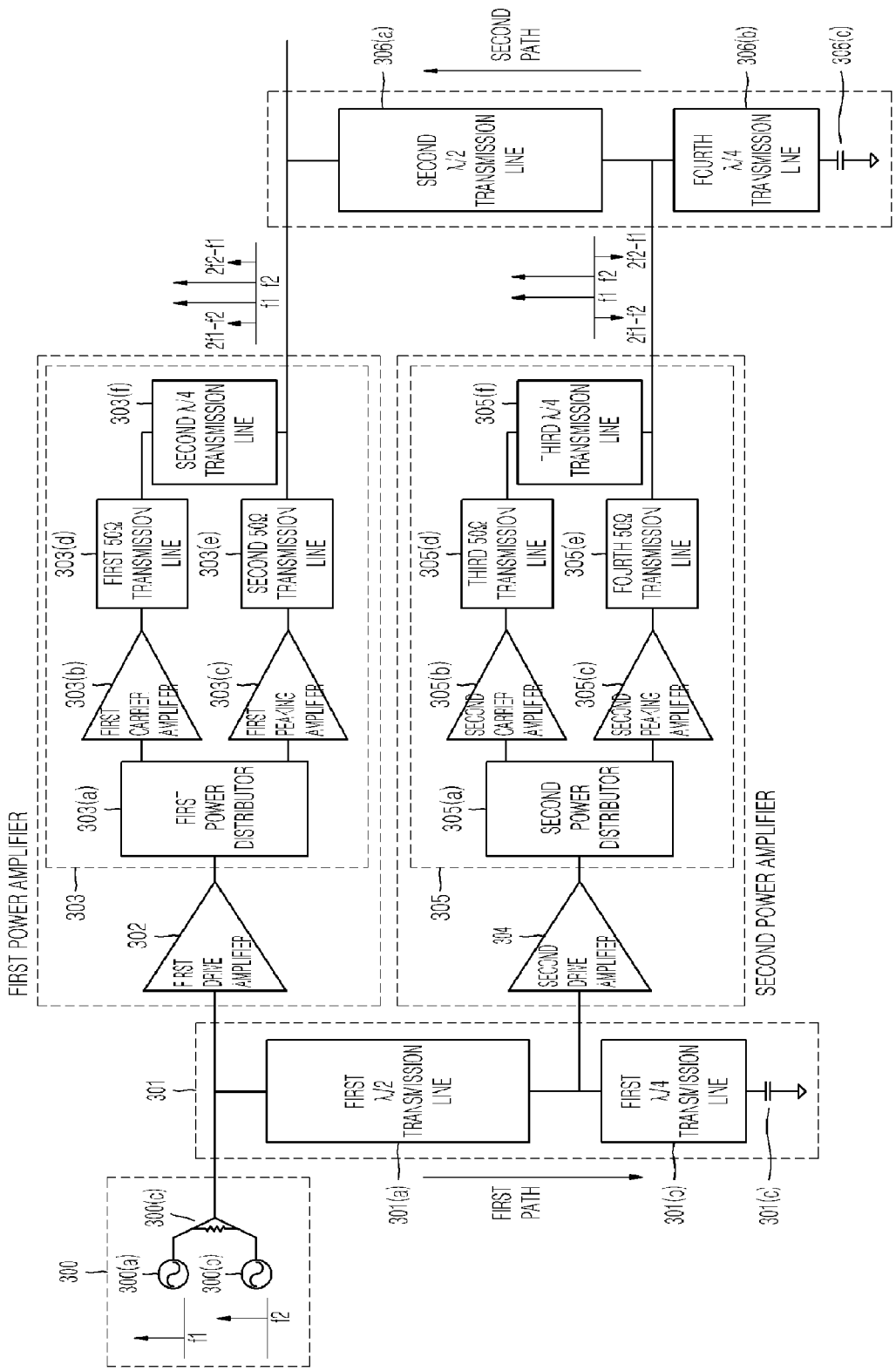
FIG. 3 is a circuit diagram of a broadband distributed Doherty power amplifier according to an embodiment of the present invention.

FIG. 3 is a circuit diagram of a broadband distributed Doherty power amplifier according to an embodiment of the present invention. The broadband distributed Doherty power amplifier includes a signal generator 300, a first path unit 301, a first power amplifier, a second power amplifier, and a second path unit 306. The first power amplifier may include a first Doherty power amplifier 303 only or both a first drive amplifier 302 and the first Doherty power amplifier 303. In case of the latter, the first power amplifier may be referred to as a first two-stage power amplifier. The second power amplifier may include a second Doherty power amplifier 305 only or both a second drive amplifier 304 and the second Doherty power amplifier 305. In case of the latter, the second power amplifier may be referred to as a second two-stage power amplifier.

Here, the signal generator 300 includes a first reference signal generator 300a, a second reference signal generator 300b, and a combiner 300c. The first path unit 301 includes a first λ/2 transmission line 301a, a first λ/4 transmission line 301b, and a first capacitor 301c.

Here, the first Doherty power amplifier 303 includes a first hybrid power distributor 303a, a first carrier amplifier 303b, a first peaking amplifier 303c, a first 50Ω transmission line 303d, a second 50Ω transmission line 303e, and a second λ/4 transmission line 303f.

Furthermore, the second power amplifier includes the second drive amplifier 304 and the second Doherty power amplifier 305, wherein the second Doherty power amplifier 305 includes a second hybrid power distributor 305a, a second carrier amplifier 305b, a second peaking amplifier 305c, a third 50Ω transmission line 305d, a fourth 50Ω transmission line 305e, and a third λ/4 transmission line 305f.

Furthermore, the second path unit 306 includes a second λ/2 transmission line 306a, a fourth λ/4 transmission line 306b, and a second capacitor 306c. A distributed Doherty power amplifier according to an embodiment of the present invention will be described below in detail with reference to FIG. 3.

Referring to FIG. 3, in the signal generator 300, input signals f1 and f2, which are input signals respectively from the first reference signal generator 300a and the second reference signal generator 300b, are combined by the combiner 300c and are output.

A source signal output by the signal generator 300 is applied to the first power amplifier and the second power amplifier via the first path unit 301, wherein the phase of the source signal is inversed by 180°. To separate a gate terminal of the second drive amplifier 304 from a ground connection, the first λ/4 transmission line 301b is connected to the first λ/2 transmission line 301a. Furthermore, the first capacitor 301c enhances frequency characteristics of the distributed Doherty power amplifier and optimizes the performance of the distributed Doherty power amplifier.

An input signal, of which the phase is the same as that of the source signal, is applied to the first drive amplifier 302 and improves the gain of the overall distributed Doherty power amplifier. An output of the first drive amplifier 302 is used as an input of the first Doherty power amplifier 303 and is applied to the first carrier amplifier 303b and the first peaking amplifier 303c via the first hybrid power distributor 303a. When an output of the distributed Doherty power amplifier is small, only the first carrier amplifier 303b operates, and the second λ/4 transmission line 303f functions as a load converter of the first Doherty power amplifier 303.

At this point, to compensate for the phase difference due to the second λ/4 transmission line 303f between the first carrier amplifier 303b and the peaking amplifier 303c, the first hybrid power distributor 303a employs a hybrid power distributor, of which phases of outputs are different by 90°. Furthermore, to prevent the output of the first carrier amplifier 303a from inputting to the first peaking amplifier 303c, the second 50Ω transmission line 303e is added to the output of the first peaking amplifier 303c, and, to compensate for a signal delay due to the second 50Ω transmission line 303e, the first 50Ω transmission line 303d is added to the output of the first carrier amplifier 303b.

In the circuit as described above, the first drive amplifier 302 and the second drive amplifier 304, the first carrier amplifier 303b and the second carrier amplifier 305b, the first hybrid power distributor 303a and the second hybrid power distributor 305a, the first 50Ω transmission line 303d and the third 50Ω transmission line 305d, the second 50Ω transmission line 303e and the fourth 50Ω transmission line 305e, and the second λ/4 transmission line 303f and the third λ/4 transmission line 305f are symmetrically arranged and perform the same functions. However, an input signal, of which the phase is inversed by 180° by the first λ/2 transmission line 301a, is used as an input of the second drive amplifier 304.

Furthermore, the output of the first Doherty power amplifier 303 and the output of the second Doherty power amplifier 305 are connected via the second λ/2 transmission line 306a to compensate for the phase difference, which is 180°, between the output of the first Doherty power amplifier 303 and the output of the second Doherty power amplifier 305. Furthermore, to separate a drain of the second Doherty power amplifier 305 from the ground connection, the fourth λ/4 transmission line 306b is connected to the output of the second Doherty power amplifier 305 and the output of the second λ/2 transmission line 306a. Furthermore, the second capacitor 306c optimizes the performance of the distributed Doherty power amplifier.

In a Doherty power amplifier, the magnitude and phase of tertiary intermodulation distortion may be changed by adjusting a gate bias of a peaking amplifier. A signal generated by the signal generator 300 is output as distortion signals $2f_1-f_2$ and $2f_2-f_1$ via the first power amplifier and the second power amplifier. Here, f1 and f indicate fundamental frequency signals in transmission bands, and $2f_1-f_2$ and $2f_2-f_1$ indicate tertiary intermodulation distortion signals. By adjusting a gate bias of the first peaking amplifier 303c and gate bias of the second peaking amplifier 305c, magnitudes and phases of tertiary intermodulation distortion signal of the output of the first Doherty power amplifier 303 and tertiary intermodulation distortion signal of the output of the second Doherty power amplifier 305 may be controlled. Furthermore, when the magnitudes of tertiary intermodulation signals of the first Doherty power amplifier 303 and the second Doherty power amplifier 305 are the same and the phases of the tertiary intermodulation signals of the first Doherty power amplifier 303 and the second Doherty power amplifier 305 are different by 180°, linearity of a distributed Doherty power amplifier may be improved.

Figure 4:
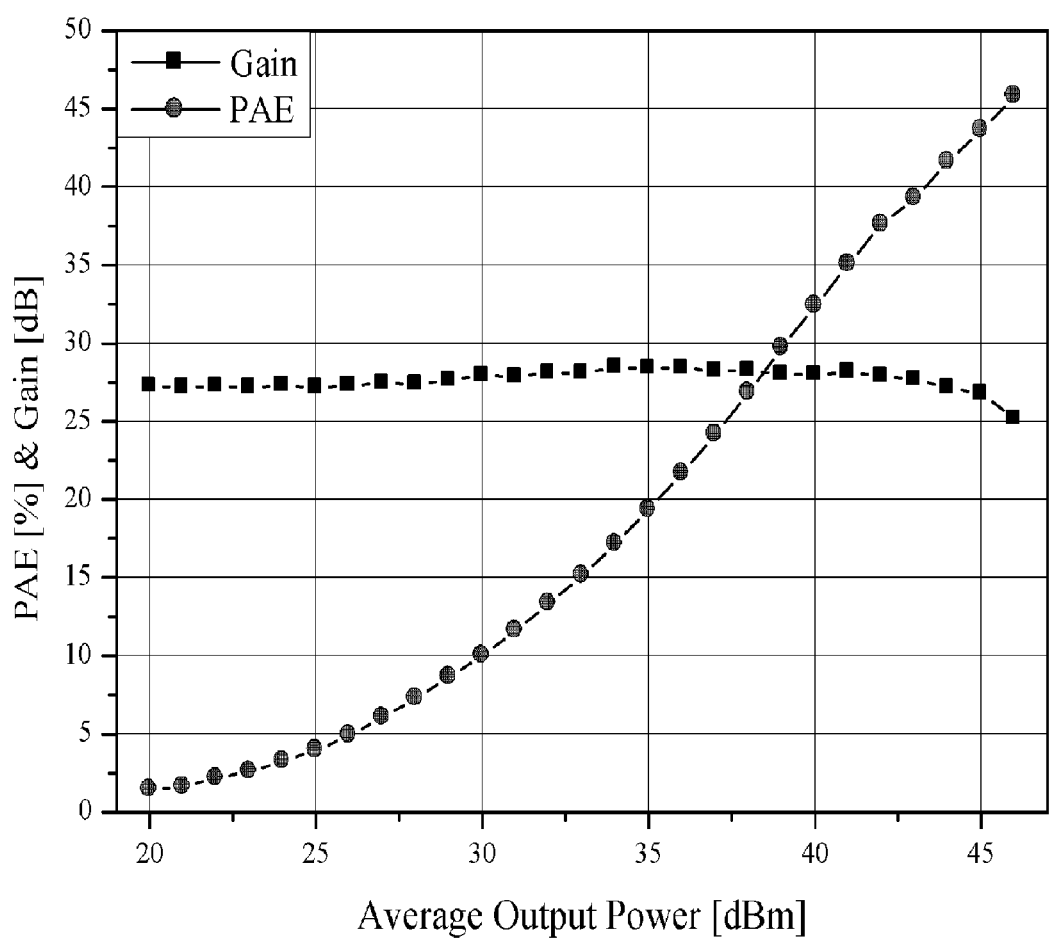
FIG. 4 is a graph showing gains and power-added efficiency (PAE) characteristics with respect to output powers in the case where the operation frequency of a distributed Doherty power amplifier according to an embodiment of the present invention is a 2.14 GHz sine wave.

FIG. 4 is a graph showing gains and power-added efficiency (PAE) characteristics with respect to output powers in the case where the operation frequency of a distributed Doherty power amplifier according to an embodiment of the present invention is a 2.14 GHz sine wave. The graph shows that the distributed Doherty power amplifier exhibits a high PAE of 45.9% and maintains gains above 27 dB in a wide range of output powers when saturated output power is 36 dBm.

Figure 5:
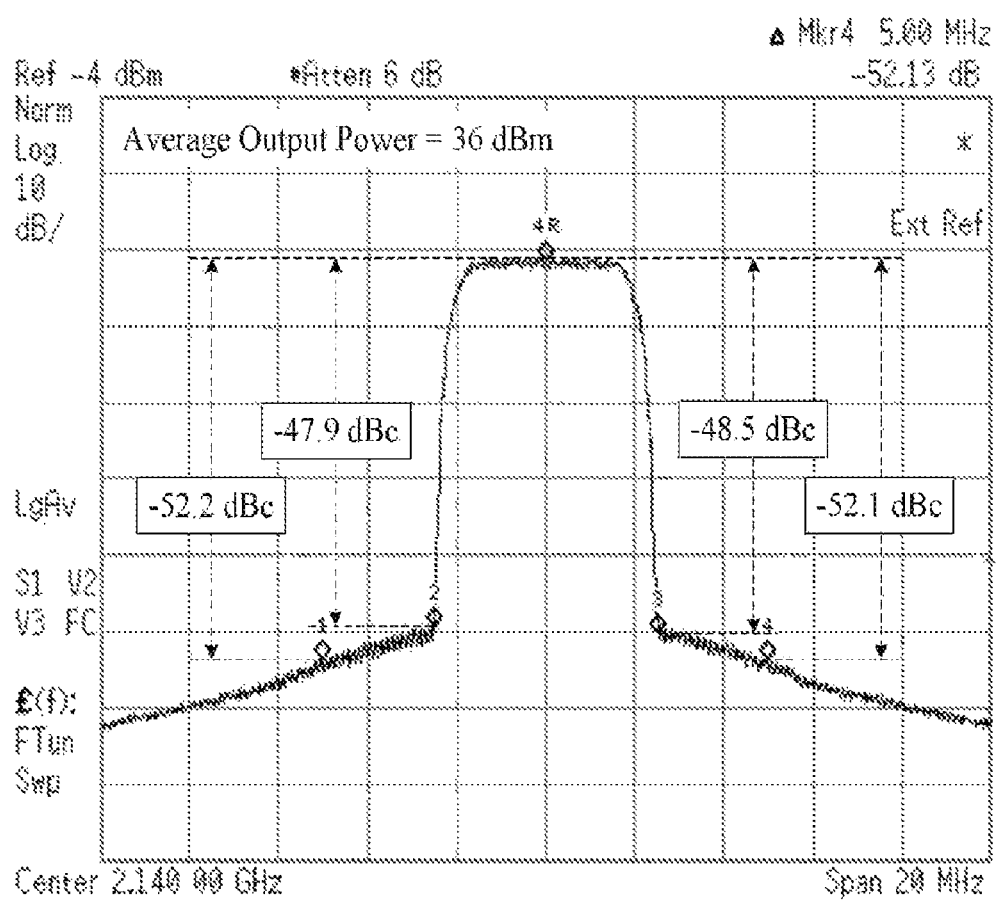
FIG. 5 is a graph showing output spectrums in the case where the center frequency is 2.14 GHz and a wideband code division multiple access (WCDMA) signal having a 5 MHz bandwidth and a 10 dB peak-to-average power ratio (PAPR) is used as an input signal in a distributed Doherty power amplifier according to an embodiment of the present invention.

FIG. 5 is a graph showing output spectrums in the case where the center frequency is 2.14 GHz and a wideband code division multiple access (WCDMA) signal having a 5 MHz bandwidth and a 10 dB peak-to-average power ratio (PAPR) is used as an input signal in a distributed Doherty power amplifier according to an embodiment of the present invention. The output power is 36 dBm, which is a result of optimizing peaking biases of a first Doherty power amplifier and a second Doherty power amplifier. Adjacent channel leakage ratios (ACLRs) at frequencies in a range ±2.5 MHz and a range ±5 MHz around the center frequency 2.14 GHz were −48 dBc and −52 dBc, respectively. The ACLR satisfies the linearity standard, which is below −45 dBc in a range ±5 MHz around the center frequency 2.14 GHz.

Figure 6:
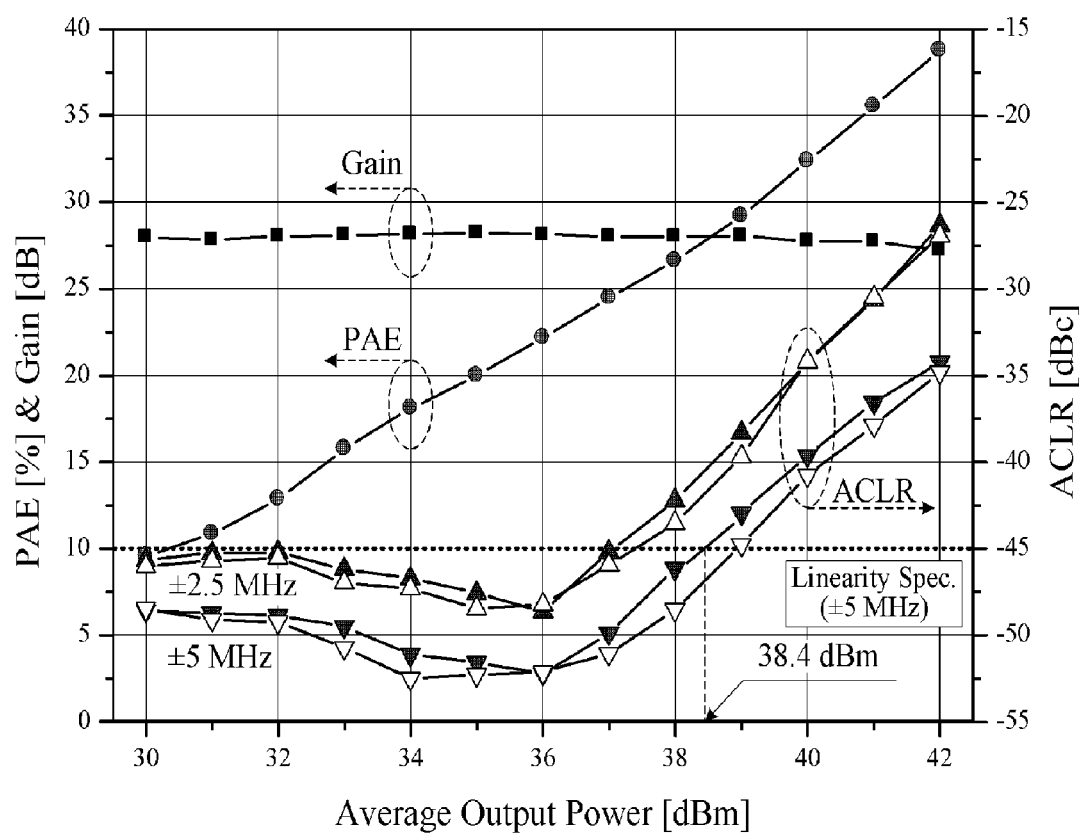
FIG. 6 is a graph showing PAE characteristics and ACLR characteristics according to output powers in the case where the center frequency is 2.14 GHz and a WCDMA signal having a 5 MHz bandwidth and 10 dB PAPR is used as an input signal in a distributed Doherty power amplifier according to an embodiment of the present invention.

FIG. 6 is a graph showing PAE characteristics and ACLR characteristics according to output powers in the case where the center frequency is 2.14 GHz and a WCDMA signal having a 5 MHz bandwidth and 10 dB PAPR is used as an input signal in a distributed Doherty power amplifier according to an embodiment of the present invention. The graph shows that linearity of the distributed Doherty power amplifier is optimized and a good ACLR is acquired in a wide range of output powers by adjusting peaking biases of a first Doherty power amplifier and a second Doherty power amplifier. Furthermore, the distributed Doherty power amplifier satisfies the linearity standard up to the output power 38.4 dBm. At this point, the distributed Doherty power amplifier exhibits a 28.1 dB gain and a 27.8% PAE.

Figure 7:
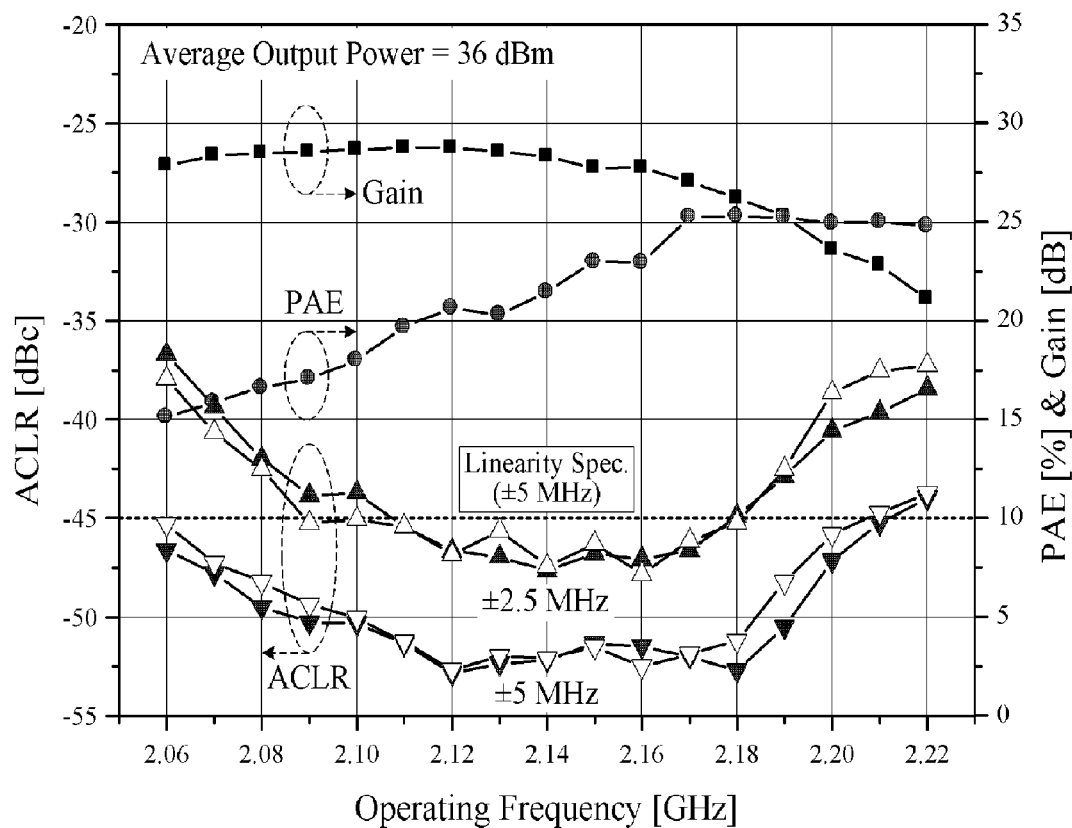
FIG. 7 is a graph showing ACLR characteristics, PAE characteristics, and gain characteristics at 36 dBm output power in the case where the center frequency is 2.14 GHz and a WCDMA signal having a 5 MHz bandwidth and 10 dB PAPR is used as an input signal in a distributed Doherty power amplifier according to an embodiment of the present invention.

FIG. 7 is a graph showing ACLR characteristics, PAE characteristics, and gain characteristics at 36 dBm output power in the case where the center frequency is 2.14 GHz and a WCDMA signal having a 5 MHz bandwidth and 10 dB PAPR is used as an input signal in a distributed Doherty power amplifier according to an embodiment of the present invention. The graph shows that the distributed Doherty power amplifier satisfies the linearity standard throughout a wide bandwidth (160 MHz) and exhibits a gain above 24 dB and a PAE above 15%.

Modules, functional blocks, or means of the present embodiment may be embodied as any of various commonly-used devices, such as electronic circuits, integrated circuits, application specific integrated circuits (ASICs), or the like, where each of modules, functional blocks, or means may be embodied as individual devices or two or more of the modules, the functional blocks, or the means may be unified to a single device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A distributed Doherty power amplifier comprising:
   a first Doherty power amplifier comprising:
      a first carrier amplifier;
      a first peaking amplifier connected to the first carrier amplifier in parallel; and
      a first power distributor configured to divide an input signal of the first Doherty power amplifier into a first signal and a second signal, input the first signal to the first carrier amplifier, and input the second signal to the first peaking amplifier;
   a second Doherty power amplifier connected to the first Doherty power amplifier in parallel, and comprising:
      a second carrier amplifier;
      a second peaking amplifier connected to the second carrier amplifier in parallel; and
      a second power distributor configured to divide an input signal of the second Doherty power amplifier into a third signal and a fourth signal, input the third signal to the second carrier amplifier, and input the fourth signal to the second peaking amplifier;
   a first shifting unit interconnected between the input of the first Doherty power amplifier and the input of the second Doherty power amplifier, and configured to inverse the phase of the input of the second Doherty power amplifier; and
   a second shifting unit interconnected between the output of the first Doherty power amplifier and the output of the second Doherty power amplifier, and configured to inverse the phase of the output of the second Doherty power amplifier.

2. The distributed Doherty power amplifier of claim 1, further comprising:
   a third shifting unit connected to the first shifting unit and the input of the second Doherty power amplifier, and configured to separate a gate of the second Doherty power amplifier from a first ground connection; and
   a fourth shifting unit connected to the second shifting unit and the output of the second Doherty power amplifier, and configured to separate a drain of the second Doherty power amplifier from a second ground connection.

3. The distributed Doherty power amplifier of claim 1, wherein the first shifting unit and the second shifting unit are $\lambda/2$ transmission lines.

4. The distributed Doherty power amplifier of claim 2, wherein the third shifting unit and the fourth shifting unit are $\lambda/4$ transmission lines.

5. The distributed Doherty power amplifier of claim 2, further comprising:
   a first capacitor disposed between the third shifting unit and the first ground connection; and
   a second capacitor disposed between the fourth shifting unit and the second ground connection.

6. The distributed Doherty power amplifier of claim 1, wherein the first Doherty power amplifier comprises:
   a first transmission line connected to the output of the first peaking amplifier and configured to prevent leakage of the output of the first carrier amplifier;
   a second transmission line connected to the output of the first carrier amplifier and configured to compensate for a delay of the first transmission line; and
   a third transmission line connected to the output of the first transmission line and the output of the second transmission line and configured to adjust load impedance of the first carrier amplifier.

7. The distributed Doherty power amplifier of claim 6, wherein the first power distributor divides the input signal of the first Doherty power amplifier such that the phases of the first signal and the second signal are different by 90°,
   wherein the first transmission line and the second transmission line are 50Ω transmission lines, and
   wherein the third transmission line is a $\lambda/4$ transmission line.

8. The distributed Doherty power amplifier of claim 1, further comprising a signal generator, a first drive amplifier, and a second drive amplifier, wherein the first drive amplifier is connected to the first power distributor and disposed between the signal generator and the first power distributor, and wherein the second drive amplifier is connected to the second power distributor and disposed between the first shifting unit and the second power distributor.

9. The distributed Doherty power amplifier of claim 1, wherein the magnitude and phase of a tertiary distortion signal is changed by adjusting gate biases of the first peaking amplifier of the first Doherty power amplifier and the second peaking amplifier of the second Doherty power amplifier.

10. The distributed Doherty power amplifier of claim 1, wherein gate biases of the first peaking amplifier of the first Doherty power amplifier and the second peaking amplifier of the second Doherty power amplifier are adjusted, so that a tertiary distortion signal of the first Doherty power amplifier and a tertiary distortion signal of the second Doherty power amplifier have the same magnitude and opposite phases.

11. The distributed Doherty power amplifier of claim 4, further comprising:
   a first capacitor disposed between the third shifting unit and the first ground connection; and
   a second capacitor disposed between the fourth shifting unit and the second ground connection.

* * * * *